(12) United States Patent
Yamamoto et al.

(10) Patent No.: US 6,896,731 B1
(45) Date of Patent: May 24, 2005

(54) P-TYPE SINGLE CRYSTAL ZINC-OXIDE HAVING LOW RESISTIVITY AND METHOD FOR PREPARATION THEREOF

(75) Inventors: Tetsuya Yamamoto, Kochi (JP); Hiroshi Yoshida, Kawanishi (JP); Takafumi Yao, Tsukuba (JP)

(73) Assignee: Japan Science and Technology Corp., Saitama-Ken (JP)

( * ) Notice: Subject to any disclaimer, the term of this patent is extended or adjusted under 35 U.S.C. 154(b) by 194 days.

(21) Appl. No.: 10/048,498

(22) PCT Filed: Jul. 4, 2000

(86) PCT No.: PCT/JP00/04452

§ 371 (c)(1),
(2), (4) Date: Apr. 30, 2002

(87) PCT Pub. No.: WO01/12884

PCT Pub. Date: Feb. 22, 2001

(30) Foreign Application Priority Data

Aug. 13, 1999  (JP) .......................................... 11/229504

(51) Int. Cl.[7] .......................... C30B 23/00; C30B 25/00; C01G 9/02; B32B 9/00
(52) U.S. Cl. .......................... 117/108; 117/88; 428/688; 428/702; 423/99
(58) Field of Search .................. 117/108, 88; 428/642, 428/658, 688, 702; 423/99

(56) References Cited

U.S. PATENT DOCUMENTS

| | | | | |
|---|---|---|---|---|
| 4,612,411 A | * | 9/1986 | Wieting et al. ............. | 136/265 |
| 5,324,365 A | * | 6/1994 | Niwa ......................... | 136/256 |
| 5,420,043 A | * | 5/1995 | Niwa ......................... | 438/96 |
| 5,578,501 A | * | 11/1996 | Niwa ......................... | 438/98 |
| 5,579,258 A | * | 11/1996 | Adachi ....................... | 365/145 |
| 5,891,243 A | * | 4/1999 | Yoshida ....................... | 117/92 |
| 6,291,085 B1 | * | 9/2001 | White et al. ................. | 428/642 |
| 6,342,313 B1 | * | 1/2002 | White et al. ................. | 428/701 |
| 6,379,521 B1 | * | 4/2002 | Nishio ......................... | 205/98 |
| 6,410,162 B1 | * | 6/2002 | White et al. ................. | 428/642 |
| 6,527,858 B1 | * | 3/2003 | Yoshida et al. ............. | 117/108 |

OTHER PUBLICATIONS

T. Yamamoto et al.; Japanese Journal of Applied Physics, vol. 38, part 2, No. 2B, pp. 166–169, Feb. 15, 1999.
K. Minegishi et al.; Japanese Journal of Applied Physics, vol. 36, part 2, No. 11A, pp. 1453–1455, Nov. 1997.
Akira Onodera, Journal of Physical Society in Japan, vol. 53, No. 4, pp. 282–286.
Akira Onodera et al., Dielectric Activity and Ferroelectricity in Piezoelectric Semiconductor Li–Doped ZnO. Japanese Journal of Applied Physics, vol. 35, (1996). Part 1, No. 9B. Sep. 1996, pp. 5160–5162.

* cited by examiner

Primary Examiner—Nadine G. Norton
Assistant Examiner—Matthew Anderson
(74) Attorney, Agent, or Firm—Westerman, Hattori, Daniels & Adrian, LLP

(57) ABSTRACT

The present invention provides a low-resistivity p-type single-crystal zinc oxide. An n-type dopant and p-type dopant are doped into zinc oxide with higher concentration of the p-type dopant than that of the n-type dopant during forming a single-crystal of the zinc oxide through a thin film forming process. Further, an element of the second group is co-doped to allow oxygen to be stabilized.

8 Claims, 2 Drawing Sheets

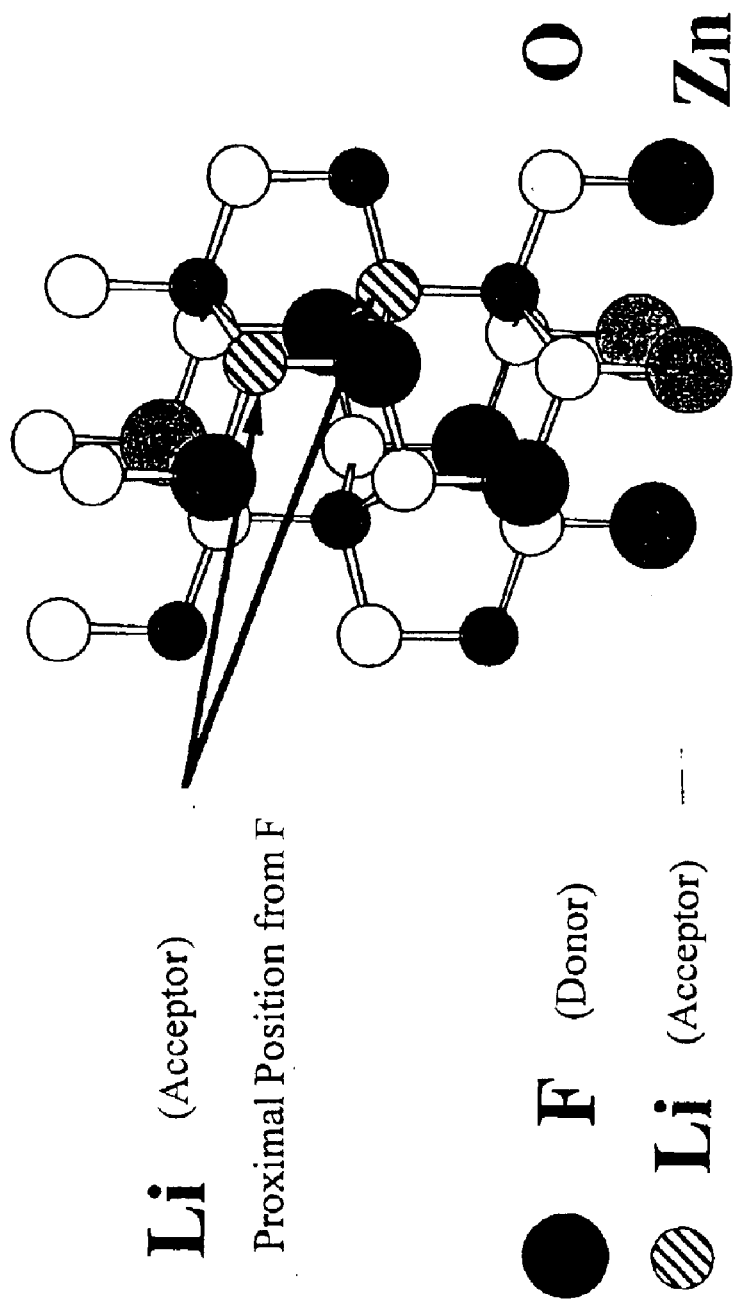

P-TYPE SINGLE CRYSTAL ZINC-OXIDE HAVING LOW RESISTIVITY AND METHOD FOR PREPARATION THEREOF

TECHNICAL FIELD

The present invention relates to a low-resistivity p-type single-crystal zinc oxide (ZnO) and a method of preparing the same.

BACKGROUND ART

It has been possible to prepare a low-resistivity n-type ZnO by a conventional B, Al, Ga or In doping technique without any difficulty. However, as for p-type ZnO, there have been only reports on a high-resistivity p-type ZnO obtained by N (Nitrogen) doping. For example, one N-doped p-type ZnO was reported from Kasuga Laboratory of Engineering Department of Yamanashi University in the 59th Meeting of the Japan Society of Applied Physics (Lecture No. 17p-YM-8, Japanese Journal of Applied Physics, Part 2, vol. 36, No. 11A, p. 1453, 1 Nov. 1997). The p-type ZnO thin film prepared by Kasuga Laboratory of Engineering Department of Yamanashi University is not suitable for practical use because of still high resistivity of 100 $\Omega \cdot cm$. Further, the p-type ZnO thin film has a remaining problem of experimental repeatability in that its conduction type is inversely changed from p-type to n-type after annealing, and has not been developed to an effective low-resistivity p-type ZnO.

Li is one element of the first group of the Periodic System and is assumed as an acceptor for fabricating p-type materials. Heretofore, Li-doping has been used only for fabricating high-resistivity ZnO thin films, and such doping effects are being studied in a field of dielectric materials as electrical insulators rather than materials for semiconductor devices. For example, in the journal of the Physical Society of Japan, vol. 53, No. 4, pp. 282–286, Akira Onodera (Graduate School of Science, Hokkaido University) has reported to prepare a Li-doped ZnO having a high resistivity (specific resistance) of $10^{10}$ $\Omega \cdot cm$ as a memory material by one crystal growth method, so-called hydrothermal method. (Problem to be solved by the invention)

Out of ZnO having a p-type conductivity, various high-resistivity p-type ZnO thin films can be fabricated, whereas it has been difficult to grow a ZnO single-crystal thin film having a low resistivity with keeping the p-type conductivity due to self-compensation-effects and low solubility of p-type dopants.

If a p-type ZnO having a low resistivity can be synthesized as a ZnO single-crystal thin film, it becomes possible to achieve a p-n junction between ZnO (zinc oxide) semiconducting compounds of the same kind by combining the synthesized low-resistivity p-type ZnO with the low-resistivity n-type ZnO (zinc oxide) which has already been put into practice through the impurity doping process using B (Boron), Al (Aluminum), Ga (Gallium) or In (Indium). This p-n junction, referred to as a homojunction, makes it possible to fabricate various semiconductor devices, such as an implantation type light-emitting diode, laser diode and thin film solar cell, with high quality and low cost. For example, the above ZnO can be used for fabricating an ultraviolet laser diode necessary for high-density recording or large-scale information transfer.

DISCLOSURE OF INVENTION (Means for solving the Problem)

In order to solve the above problem, the inventors have developed a novel doping method for incorporating a p-type dopant into ZnO to achieve enhanced stabilization in ZnO.

More specifically, the present invention is directed to a low-resistivity p-type single-crystal ZnO containing a p-type and an n-type. The present invention is also directed to a low-resistivity p-type single-crystal ZnO containing a p-type, an n-type, and the second group element.

In the low-resistivity p-type single-crystal ZnO according to the present invention, the n-type dopant may be one or more elements selected from the group consisting of B, Al, Ga, In, Zn, F, Cl and H. Further, the p-type element may be one or more elements selected from the group consisting of the first group elements, the fifth group elements and C, preferably of Li, Na, N and C.

The concentration ratio of the contained p-type dopant to the contained n-type dopant is preferably set in the range of 1.3:1 to 3:1, most preferably in 2:1. The low-resistivity p-type single-crystal ZnO according to the present invention has a hole concentration of $2 \times 10^{18}/cm^3$ or more, more preferably $1 \times 10^{19}/cm^3$ or more. Further, the low-resistivity p-type single-crystal ZnO has an electrical resistivity of 20 $\Omega \cdot cm$ or less, more preferably 10 $\Omega \cdot cm$ or less, more specifically less than 1 $\Omega \cdot cm$.

The n-type dopant and p-type dopant are pared up in a ZnO single-crystal by doping the n-type and p-type dopants into the ZnO single crystal. In this state, carriers will be scattered not by the p-type dopants with a charge but by p-type dopants with a smaller charge, to be screened by virtue of the n-type dopant having an opposite charge to that of the p-type dopant. This leads to the realization of the mobile carriers. Thus, the hole mobility of carriers is significantly increased, and thereby a desired low-resistivity p-type single-crystal ZnO can be obtained.

The second group elements of the Periodic System have no influence on the conduction type, and contribute to stabilization of oxygens in the basal ZnO semiconducting compound to carry out a function of reducing the concentration of oxygen vacancy. In the second group elements, Mg and/or Be are particularly desirable to achieve this function.

Further, the present invention is directed to a method of preparing a low-resistivity p-type single-crystal zinc oxide in which an n-type dopant and p-type dopant are doped into zinc oxide with higher concentration of the p-type dopant than that of the n-type dopant during forming a single-crystal of the zinc oxide through a thin film forming process.

Further, the present invention is directed to a method of preparing a low-resistivity p-type single-crystal zinc oxide in which n-type and p-type dopants and at least one of Mg and Be are doped into zinc oxide with higher concentration of the p-type dopant than that of the n-type dopant and that of the at least one of Mg and Be during forming a single-crystal of the zinc oxide through a thin film forming process.

In this method of preparing a low-resistivity p-type single-crystal zinc oxide according to the present invention, the thin film forming process may include the step of supplying an atomic gas from a Zn solid source and an active oxygen onto a semiconductor substrate to grow a single-crystal zinc oxide thin film on the substrate.

In the above methods of preparing a low-resistivity p-type single-crystal zinc oxide according to the present invention, an atomic gas vaporized from a Zn solid source by use of MOCVD (Metal Organic Chemical Vapor Deposition) or MBE (Molecular Beam Epitaxy) using an atomic beam and an active oxygen may be flowingly supplied onto and deposited at a low temperature on a semiconductor substrate to grow a single-crystal zinc oxide thin film on the semiconductor substrate under sufficient oxygen plasma. During this process, the p-type and n-type dopants and at least one of the second group elements are doped into the zinc oxide.

According to the present invention, the doped p-type and n-type dopants can suppress the increase of electrostatic energy due to Coulomb's reaction force between the p-type dopants, and can bring out Coulomb's attraction force between the n-type and p-type dopants to create an energy gain. The gain from the above electrostatic interaction allows more p-type dopants to be effectively incorporated, so as to achieve further enhanced stabilization of the ionic charge distributions in ZnO. Thus, the p-type dopant can be stably doped in a high concentration. While the n-type and p-type dopants may be doped separately at different timings, it is desired to simultaneously dope or co-dope them.

The higher concentration of the p-type dopant than that of the n-type dopant can be specifically provided by adjusting their amount to be incorporated or the pressure of the atomic gas. The p-type dopant and/or the n-type dopant and/or the second group element can be transformed into an atomic form by electronically exciting them with the use of radiofrequency waves, lasers, X-rays or electron beams. Preferably, the substrate has a temperature ranging from 300° C. to 650° C. The temperature less than 300° C. causes extremely reduced growth rate of the thin film, which is not suitable for practical use. The temperature higher than 650° C. causes intensive oxygen escaping, resulting in increased defects, degraded crystallization and lowered doping effects. The substrate may include a silicon single-crystal substrate, a silicon single-crystal substrate having a SiC layer formed therein and a sapphire single-crystal substrate. Preferably, the substrate has the same crystal structure as that of ZnO, and has almost the same lattice constant as that of ZnO. However, no above currently used substrates meet this requirement, and thereby there is not any significant difference in merit and demerit therebetween. Further, the substrate and thin film may interpose therebetween a chromium oxide layer or titanium oxide layer having an average valve of respective lattice constants of the substrate and thin film to reduce unconformity in crystal lattices.

Further, in the present invention, it is preferable that after forming the low-resistivity p-type single-crystal zinc oxide on the substrate, the formed single-crystal zinc oxide is cooled down to room temperature, and then subjected to a heat treatment at a high temperature ranging, for example, from about 100 to 250° C. under an electric field. This allows hydrogen, which in generally behave as a donor, to be removed outside. The size of energy gap can be freely controlled by combining the low-resistivity p-type single-crystal ZnO with the conventional low-resistivity n-type ZnO (zinc oxide). This provides an optoelectronics material having a high performance over the range from visible light to ultraviolet light and a wide range of application in an implantation type light-emitting diode or laser diode. Further, the applicable area can be expanded to various photoelectric conversion devices or low-resistivity semiconductors such as a solar cell.

Further, a magnetism-semiconductor hybrid-function element can be fabricated by doping a transition metal, Mn, Fe or Co, which is a magnetic element, into the thin layer of the low-resistivity p-type single-crystal ZnO.

(Function)

According to the doping effects in the present invention, a donor-acceptor pair (e.g. Li—F—Li or N—Ga—N) is formed in the crystal, (1) to suppress the increase of electrostatic energy due to Coulomb's reaction force between the p-type dopants, and increase the solubility of additional p-type dopants, and (2) to allow the scattering extent of the dopants acting to the dynamics of holes, which is 100 angstroms or more in a single doping, to interact in a shorter range of several tens of angstroms, and thus allows average free mobility of carriers to be increased.

Further, the second group element, particularly Mg or Be, is doped (3) to form a strong chemical bonding between Mg—O or Be—O in the crystal so as to prevent oxygen escaping. The above three effects make it possible to dope the p-type dopant stably in a high concentration, and the resulting low-resistivity p-type single-crystal ZnO can be used as an optoelectronics material over the range from visible light to ultraviolet light.

While the single crystal ZnO thin film is particularly subject to oxygen escaping, one or more elements selected from the group consisting of B, Al, Ga, In, Zn, F, Cl and H occupy the resulting oxygen vacancy to prevent the degradation of crystallization due to the vacancy formation, and the p-type dopant, typically one or more elements selected from the group consisting of Li, Na, N and C, is stabilized at Zn coordination (O coordination in case of N) by ionic bonding.

For example, Li and F are used as a p-type dopant and n-type dopant, respectively, and these dopants are doped, for example, by F: Li=1:2. As a result, a strong chemical bonding is created between the adjacent F and Li to form a complex of Li—F—Li in the ZnO crystal thin film. If Li is singly doped, the energy in lattice system is increased, and thereby an oxygen vacancy is induced. The vacancy acts as a donor and causes the degradation of crystallization. Thus, the Li moves between lattices, and thereby the roll of the Li is inversely changed from acceptor to donor. This blocks the creation of a low-resistivity p-type single-crystal ZnO thin film.

On the other hand, in F and Li co-doped crystal, the doped Li is stabilized after the complex is formed and thereby the stabilized Li moves to shallow level. This allows more carriers to be created at lower temperature (at the temperature closer to room temperature) to provide a desired low-resistivity p-type single-crystal ZnO thin film.

BRIEF DESCRIPTION OF DRAWINGS

FIG. 2 is a schematic diagram showing the configuration of p-type dopants and n-type dopants, which is determined by use of the first-principles band structure alculation method.

BEST MODE FOR CARRYING OUT THE INVENTION

Figure 1:
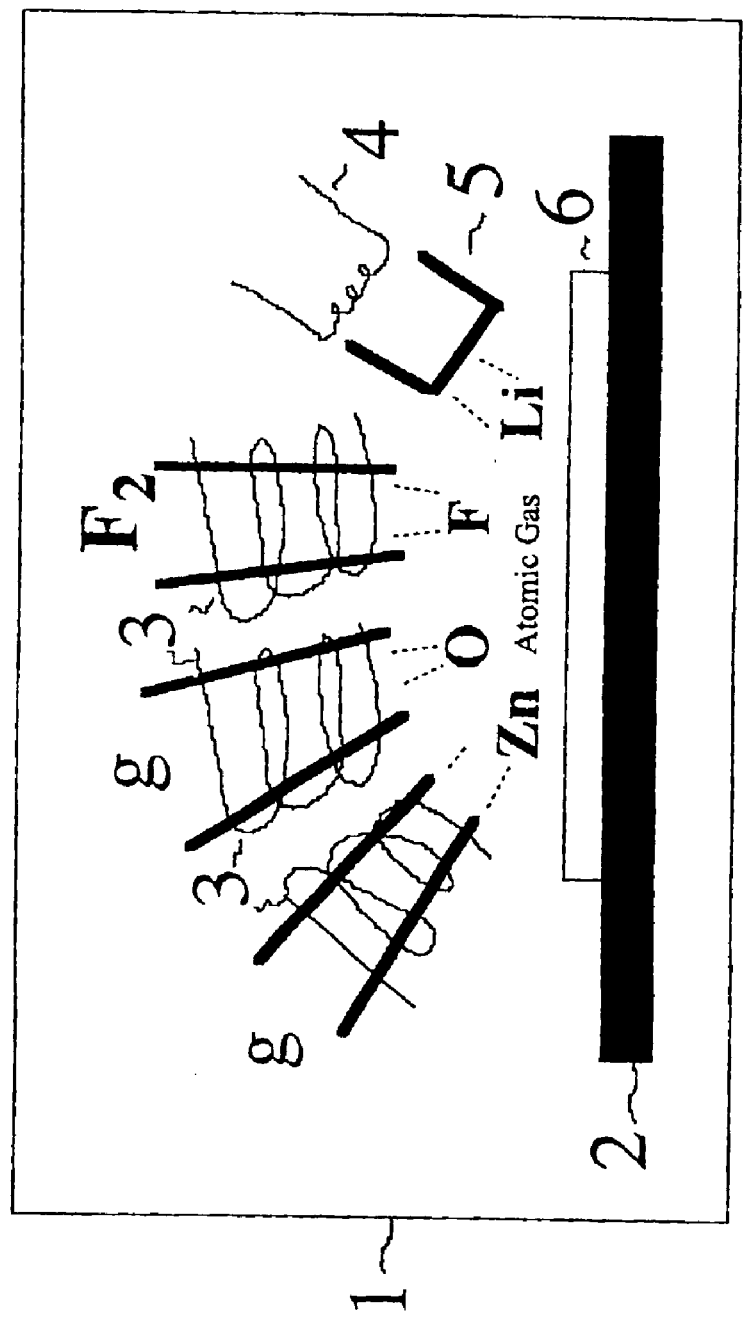
FIG. 1 is a conceptual diagram showing the schematic inner structure of a vacuum chamber for forming a low-resistivity p-type single-crystal ZnO thin film on a substrate by use of the MBE method.

With reference to an example, a method for forming a p-type single-crystal ZnO thin film on a substrate by use of the MBE method will now be described in detail.

As shown in FIG. 1, a sapphire substrate 2 was placed in a vacuum chamber 1 having a maintained internal pressure of $10^{-8}$ Torr, and an atomic Zn gas and an atomic O gas were supplied onto the substrate 2 to fablicate a ZnO thin film on the substrate 2. The atomic Zn gas was prepared by heating a Zn solid source having a purity of 99.99999% with a heater to bring it into an atomic form. The atomic O gas was prepared by activating oxygen having a purity of 99.99999% with an RF radical cell. Each of Li serving as a p-type acceptor and F serving as an n-type donor was prepared by radiating the microwave level of electromagnetic waves to a corresponding molecular gas or by bringing a corresponding elemental cell into an atomic form under a high temperature. FIG. 1 shows an RF (radio frequencies) coil 3, a heater 4, and an elemental cell (Li source) 5, which are used in this method. During forming a film, F as an n-type dopant and Li as a p-type dopant were simultaneously supplied onto the substrate 2 at a partial pressures of $10^{-7}$ Torr and a partial pressure of $5 \times 10^{-7}$ Torr, respectively, to induce the crystal growth for forming a p-type single-crystal ZnO thin film 6 at each temperature of 350° C., 400° C., 450° C. and 600° C. For the p-type single-crystal ZnO thin film obtained at each of the above crystal growth temperatures, hole concentration, resistivity and hole mobility were determined according to a hole measurement and a four-probe method. Table 1 shows this measurement result with comparing to the case where only Li as a p-type dopant was ingly doped without co-doping F as an n-type dopant.

Table 1 also shows the case (2) where Mg and Li were co-doped and the case (4) where Li, F and Mg were co-doped. In these cases, the Mg was prepared by radiating the microwave level of electromagnetic waves to a corresponding molecular gas or by bringing a corresponding elemental cell into an atomic form under a high temperature. In case of co-doping three of Li, F and Mg, an additional component is only one elemental cell.

As can be seen in the hole concentration (number/cm$^3$) shown in Table 1, higher crystal growth temperature provides higher hole concentration. As compared to the result of doping Li singly (1), each of the result of co-doping Li and Mg (2), the result of co-doping Li and F (3), and the result of co-doping Li, F and Mg (4) exhibits a hole concentration having larger digits by three or more.

TABLE 1

| Substrate Temperature (° C.) | Hole Concentration (number/cm$^3$) | | | | Hole Mobility (cm$^2$/V·g) | | | | Resistivity (Ω·cm) | | | |
|---|---|---|---|---|---|---|---|---|---|---|---|---|
| | (1) | (2) | (3) | (4) | (1) | (2) | (3) | (4) | (1) | (2) | (3) | (4) |
| | $10^{15}$ | $10^{18}$ | $10^{18}$ | $10^{18}$ | | | | | $10^8$ | | | |
| 350 | 1 | 2 | 10 | 8 | — | 80 | 75 | 75 | 90 | 20 | 8 | 10 |
| 400 | 3 | 3 | 15 | 10 | — | 85 | 80 | 78 | 60 | 9 | 2 | 3 |
| 450 | 6 | 8 | 50 | 20 | — | 90 | 95 | 88 | 10 | 0.9 | 0.3 | 0.4 |
| 600 | 8 | 10 | 90 | 60 | — | 93 | 150 | 105 | 2 | 0.25 | 0.01 | 0.08 |

(1) the result of doping Li singly. (2) the result of co-doping Li and Mg. (3) the result of co-doping Li and F. (4) the result of co-doping Li, F and Mg.

Further, as compared to the result of doping Li singly (1), it is proved that each of the results (2) to (4) exhibits a hole mobility (cm2/V·g) having larger digits by two or more. In case of co-doping, the resistivity (Ω·cm) in inverse proportion to the product of the hole concentration and hole mobility has reduced digits by five or more as compared to the case of singly doping, and goes down to less than 10 Ω·cm when the substrate temperature is 400° C. or more.

Further, in the sample of co-doping three elements of Li, F and Mg, even at a low crystal growth temperature of 350° C., a p-type single-crystal ZnO thin film could be obtained with a high hole concentration of $8 \times 10^{18}$ (number/cm$^3$). Thus, a p-type single-crystal ZnO thin film having a low resistivity of 10 Ω·cm could be obtained.

FIG. 2 shows the configuration of two acceptors and one donor in a ZnO crystal, which is determined by use of the first-principles band structure calculation method. As can be seen in FIG. 2, it has been verified that the crystallographic configuration of Li was stabilized by adding Li as an acceptor and F as a donor in the ZnO crystal, and thereby Li could be doped stably in a high concentration. Mg of the second group element is located substantially independently of Li and F to stabilize oxygen.

INDUSTRIAL APPLICABILITY

As described above, ZnO of the present invention is a novel low-resistivity p-type single-crystal ZnO which has not been achieved, and this single crystal ZnO has a innovative broader range of applications. Further, the method of the present invention makes it possible to obtain the low-resistivity p-type single-crystal ZnO readily.

What is claimed is:
1. A low-resistivity p-type single-crystal zinc oxide containing a p-type dopant and an n-type dopant, wherein said p-type dopant is one or more elements selected from the group consisting of Li and Na.

2. A low-resistivity p-type single-crystal zinc oxide as defined in claim 1, wherein said n-type dopant is one or more elements selected from the group consisting of B, Al, Ga, In, Zn, F, Cl and H.

3. A low-resistivity p-type single-crystal zinc oxide containing a p-type dopant, an n-type dopant, and a second group element.

4. A low-resistivity p-type single-crystal zinc oxide as defined in claim 3, wherein said second group element is Mg and/or Be.

5. A method of preparing a low-resistivity p-type single-crystal zinc oxide in which an n-type dopant and p-type dopant are doped into zinc oxide with higher concentration of said p-type dopant than that of said n-type dopant during forming a single-crystal of the zinc oxide through a thin film forming process, wherein said p-type dopant is one or more elements selected from the group consisting of Li and Na.

6. A method of preparing a low-resistivity p-type single-crystal zinc oxide in which n-type and p-type dopants and at least one of Mg and Be are doped into zinc oxide with higher concentration of said p-type dopant than that of said n-type dopant and that of said at least one of Mg and Be during forming a single-crystal of the zinc oxide through a thin film forming process.

7. A method of preparing a low-resistivity p-type single-crystal zinc oxide, as defined in claim 5 or 6, which further include the step of supplying an atomic gas from a Zn solid source and an active oxygen onto a semiconductor substrate to grow a single-crystal zinc oxide thin film on said substrate.

8. A method of preparing a low-resistivity p-type single-crystal zinc oxide, as defined in claim 5 or 6, which further include the step of cooling said formed the low-resistivity p-type single-crystal zinc oxide on said substrate, and then subjecting said cooled single-crystal zinc oxide to a heat treatment at a high temperature under an electric field.

* * * * *